United States Patent [19]
Coronel et al.

[11] Patent Number: 5,807,761
[45] Date of Patent: Sep. 15, 1998

[54] METHOD FOR REAL-TIME IN-SITU MONITORING OF A TRENCH FORMATION PROCESS

[75] Inventors: Philippe Coronel, Massy; Jean Canteloup, Montlhery, both of France

[73] Assignee: International Business Machines Corporation, Armonk, N.Y.

[21] Appl. No.: 683,934

[22] Filed: Jul. 19, 1996

[30] Foreign Application Priority Data

Jul. 24, 1995 [EP] European Pat. Off. .............. 95480099

[51] Int. Cl.⁶ ...................................................... H01L 21/66
[52] U.S. Cl. ................................ 438/14; 438/9; 438/723; 216/59; 216/60; 204/192.13; 204/192.33
[58] Field of Search .............................. 156/643.1, 626.1, 156/644.1, 657.1; 216/63, 67, 59, 60; 204/298.32, 192.13, 192.33; 438/7, 8, 9, 14, 101, 102, 694, 695, 719, 723

[56] References Cited

U.S. PATENT DOCUMENTS

| | | | |
|---|---|---|---|
| 4,454,001 | 6/1984 | Sternheim | 156/626 |
| 4,479,848 | 10/1984 | Otsubo et al. | 156/626 |
| 4,916,511 | 4/1990 | Douglas | 357/23.6 |
| 5,045,149 | 9/1991 | Nulty | 156/627 |
| 5,294,289 | 3/1994 | Heinz et al. | 156/626 |
| 5,322,590 | 6/1994 | Koshimizu | 156/626 |
| 5,362,356 | 11/1994 | Schoenborn | 156/626 |
| 5,565,114 | 10/1996 | Saito et al. | 216/60 |

OTHER PUBLICATIONS

IBM Technical Disclosure Bulletin, vol. 28, No. 9, Feb. 1986, pp. 3952–3954.
Hayashi Masakazu, et al., "Etching Monitoring Device", Patent Abstract of Japan, JP4098104, Mar. 30, 1992, vol. 16, No. 330.
IBM Technical Disclosure Bulletin, vol. 34, No. 5, Oct. 1991, pp. 200–201.
IBM Technical Disclosure Bulletin, vol. 33, No. 7, Dec. 1990, pp. 102–103.

*Primary Examiner*—R. Bruce Breneman
*Assistant Examiner*—Luz Alejandro
*Attorney, Agent, or Firm*—Dale M. Crockatt, Esq.; Daryl K. Neff, Esq.

[57] ABSTRACT

In the manufacturing of 16 Mbit DRAM chips, the deep trench formation process in a silicon wafer by plasma etching is a very critical step when the etching gas includes $O_2$. As a result, the monitoring of the trench formation process and thus the etch end point determination is quite difficult. The disclosed monitoring method is based on zero order interferometry. The wafer is placed in a plasma etcher and a plasma is created. A large area of the wafer is illuminated through a view port by a radiation of a specified wavelength at a normal angle of incidence. The reflected light is collected then applied to a spectrometer to generate a primary signal S of the interferometric type. Next, this signal is applied in parallel to two filters. A low-pass filter produces a first secondary signal S1 that contains data related to the deposition rate and the redeposited layer thickness. A band-pass filter produces a second secondary signal S2 that contains data related to the trench etch rate and depth. The band-pass filter is centered around the fundamental frequency of the interferometry phenomenon. These filtered signals are monitored as standard and the trench formation parameters such as the $SiO_2$ redeposited layer thickness and the trench depth are accurately measured in real time to allow an accurate determination of the etch end point. It is worthwhile to have the optical emission of the plasma viewed by another spectrometer to generate a second primary signal S* that is used to validate the parameter measurements.

12 Claims, 5 Drawing Sheets

METHOD FOR REAL-TIME IN-SITU MONITORING OF A TRENCH FORMATION PROCESS

FIELD OF INVENTION

The present invention relates to the manufacture of semiconductor integrated circuits incorporating trenches and more particularly to a method for real-time and in-situ monitoring the trench formation process by dry etching techniques. The method allows an accurate etch end point detection.

BACKGROUND OF THE INVENTION

Deep trench technology is a key factor in the development of advanced bulk CMOS and bipolar semiconductor devices for improved device performance and density. Trenches are extensively used in the semiconductor technology mainly for the isolation of bipolar devices or in the fabrication of capacitors in DRAM memory chips. An essential parameter of the trench during fabrication is its depth which can vary from 3 to 10 μm for a capacitor trench and from 3 to 20 μm for an isolation trench. Different techniques have been developed so far for anisotropically etching trenches in semiconductor substrates, but dry (plasma) etching techniques such as reactive ion etching (RIE) are certainly the most commonly used to date.

A state of the art deep trench formation process in the manufacturing of CMOS DRAM cells with trench capacitors is briefly described hereafter in conjunction with FIGS. 1 to 5. These drawings are cross-sectional views of a semiconductor structure at different stages of the processing.

As shown in FIG. 1, there is illustrated a portion of a conventional semiconductor wafer. The structure referenced 10 comprises a silicon (Si) substrate 11 coated with a composite insulating layer forming the so-called trench pad 12. Said composite layer typically consists of a bottom 15 nm thick silicon dioxide ($SiO_2$) layer 13, an intermediate 175 nm thick silicon nitride (Si3N4) layer 14 and a top 500 nm pyrolitic silicon dioxide layer 15. The latter is preferably deposited by a Low Pressure Chemical Vapor Deposition (LPCVD) technique using tetra ethyl ortho silicate (TEOS). A layer 16 of a photoresist material, e.g. AZ1350J supplied by HOECHST, Wiesbaden, Germany, is formed on top of the structure with a thickness of about 1100 nm. Semiconductor structure 10 must be understood as a part of a wafer to be processed that includes a great number of chips. The photoresist layer 16 is exposed through a lithographic mask to UV light, then developed as standard to produce a photoresist mask with the desired pattern. At this initial stage of the process, the structure is shown in FIG. 1.

Now, the patterned layer 16 will be used as an in-situ mask for patterning the successive underlying layers forming trench pad 12 by dry etching. Current VLSI dry etching processes are achieved either by high pressure planar plasma etching or by low pressure reactive ion etching. The etch process is typically dependent upon the generation of reactive species (atoms, radicals, ions) from a determined gas that are impinged on the surface of the material to be etched. A chemical reaction takes place between the material and these species and the gaseous reaction product is then removed from the surface. Typically, the Magnetically Enhanced Reactive Ion Etching (MERIE) AME PRECISION 5000 tool, supplied by APPLIED MATERIALS INC, Santa Clara, Calif., USA, is appropriate to etch the trench pad 12 through the photoresist mask 16. Different compositions of gas may be used. For instance, carbon tetrafluoride (CF4) with the following operating conditions:

CF4 flow: 105 sccm
power: 600 W
pressure: 17 Pa

Next, the remaining photoresist layer 16 is removed as standard, for example by ashing in 02 and N2 at 245° C. in another reaction chamber of the AME 5000 tool. At the end of this step, the resulting structure with an opening referenced 17 in the trench pad 12 is shown in FIG. 2. As apparent from FIG. 2, a slight removal of the silicon substrate 11 due to overetching can be noticed. Opening 17 may be a hole as standard but is not limited to that particular shape.

Finally, the silicon substrate 11 is etched for trench formation using the patterned trench pad 12 as an in-situ mask until the desired trench depth is reached. Typically, this is accomplished by a relatively complex process which employs an oxygen-based chemistry that causes continuous SiO2 redeposition at a variable rate as long as the trench is being etched. For instance, a HBr+NF3+02 gas mixture, wherein oxygen is diluted in He (30% 02/70% He) is appropriate. In particular, this composition produces fluorine radicals (F) that etch silicon and bromine radicals (Br) which combine with the etched silicon to form silicon bromide radicals (SiBr). In turn, the silicon bromide radicals react with the oxygen to produce said SiO2 redeposited layer. Typical operating conditions read as follows:

HBr gas flow: 65 sccm
NF3 gas flow: 12 sccm
He/02 gas flow: 20 sccm
power: 700 W
pressure: 13 Pa
magnetic field: 20 Gauss.

This essential step will be described in more details by reference to FIGS. 3 to 5.

First of all, in a preliminary cleaning step, the above gas mixture (without oxygen) is used to remove the native oxide layer that was produced on the exposed silicon surface during the previous step of patterning the trench pad 12. This layer, and more generally any source of contamination, cause micro-masking effects that would be detrimental to the DRAM chip reliability.

Next, the HBr+NF3+He/02 gas mixture and the MERIE tool mentioned above are used to selectively etch silicon with the strong anisotropy that is desired. As the silicon is etched, successive layers of thin pyrolitic silicon dioxide, assumed stoichiometric (SiO2), are redeposited onto the structure and in particular passivate the trench side-walls forming a collar thereon. SiO2 redeposition insures adequate slope formation and trench side-wall smoothness. This is apparent from FIG. 3, which illustrates the trench formation process at an initial stage.

In FIG. 3, the SiO2 redeposited layer and the trench are referenced by numeral 18 and 19 respectively. It is important to remark the particular shape of the redeposited SiO2 layer at the top of the trench which forms a neck above a typical tapered structure. As soon as etching is initiated, the trench depth D and the thickness E of the redeposited layer are continuously monitored.

FIG. 4 shows the structure 10 at an intermediate stage of the trench formation process. The thickness of the SiO2 redeposited layer has increased and is at a maximum. On the contrary, the neck dimensions are at a minimum. If the neck dimensions are too small, the trench opening can be obstructed causing extinction of the plasma.

From now, the thickness of the redeposited SiO2 layer 18 tends to decrease while the neck dimensions tends to increase. As soon as the desired final trench depth Df is reached, the etching process is stopped. At this final stage of the trench formation process, the resulting structure is shown in FIG. 5. In particular, FIG. 5 shows the typical profile of the trench 19 with the redeposited layer 18 formed thereon. The final trench depth Df is obviously the key parameter of the trench formation process. However, the final thickness Ef of the redeposited SiO2 layer and the final slope angle of the trench are also other important parameters. The thickness E of the redeposited layer must be carefully monitored because, by no means, the top of the pyrolitic SiO2 layer 15 must be attacked during the trench formation process.

There is no doubt that the physical characteristics of the trench must be very carefully controlled to achieve satisfactory results in most applications. This is more particularly true in the DRAM technology where the trench cross-sectional profile illustrated by its final slope angle and final depth Df are of particular concern in all respects. Therefore, it is of paramount importance to have these parameters, and in particular the trench depth D and the thickness E of the redeposited layer 18, continuously and accurately monitored during the trench formation process. Known methods to monitor such a deep trench formation process include ellipsometry, laser diffractometryand infra-red interferometry.

Using the former technique, the thickness E of the SiO2 redeposited layer 18 is continuously measured by ellipsometry to determine the variations thereof, because there is a relatively good correlation between the thickness evolution (which depends on the etching duration or time t) and the slope angle. Unfortunately, the correlation is relatively poor with respect to the corresponding depth D, because trenches may have different final depths Df with the same final taper angle. As result, after completion of the trench, a sample wafer at the stage of the structure of FIG. 5, is sliced to provide a cross-section which, through SEM analysis, permits the exact determination of the final depth Df. Should this value be out of specifications, the whole lot of wafers would be rejected. Therefore, ellipsometry is not an accurate monitoring method, it requires an extra analysis step and may finally result in wafer waste.

According to the laser diffractometry technique, a small diameter laser beam is impinged on the surface of the wafer at a normal angle of incidence. Each individual trench of the trench pattern causes diffraction of the incident beam. Because of the different beam incidences on all the individual trenches, the reflected beam has several orders of reflection, referred to as the zero, first, second . . . etc. The zero order cannot be exploited by the diffractometer because of its high intensity and because it contains non pertinent information. Thus, the first order and the next ones of the reflected beam are used instead. The reflected beam is focused on a photo diode detector to produce an electrical signal which is representative of the intensity variation. This signal allows on-line trench etch rate and depth calculations during the etching. However, this technique has some drawbacks. To obtain a good signal to noise ratio, the system uses a sophisticated optical device associated to a large view port in order to capture a maximum of refracted orders. Consequently, it requires an expensive and relatively sophisticated equipment. In addition, the detector and the wafer must be oriented in a particular direction. The beam cross-section is about of a few square millimeters and is therefore not representative of a large area of the wafer. Finally, this technique has a very low reproducibility because of the signal distortion caused by the inherent deposition of materials on the view port of the reaction chamber of the RIE equipment.

Finally, the infra-red interferometry technique is based on the use of a determined wavelength (in a range of four to twenty five times higher than the trench dimensions) generated by a laser. Because structure 10 contains a pattern composed of a great number of trenches (one capacitor trench per stored bit) it acts like a two-dimensional diffraction grating for the first and higher orders. In the case of normal incidence, successive minima of the interference signal are separated by a distance which corresponds to the etched thickness during one period T. A system implementing this technique requires a kind of training to determine the refractive index of the material through comparative steps. The reflected signal is recorded and used to calculate trench etch rate and depth parameters in real-time. According to recently published papers, this technique appears to provide high precision measurements because of the selected range of wavelengths but remains limited to research laboratories and none equipment adapted to the manufacturing environment has been commercially made available as of yet. Moreover, this technique appears to be expensive, difficult to maintain and not well adapted to present application where the thickness of the redeposited layer varies during the trench formation process.

All these techniques have thus specific limitations but they all have in common that they can only analyze and monitor one event, for instance the evolution of either the thickness E of the redeposited layer or the trench depth D. As a matter of fact, none equipment adapted to the manufacturing environment has been commercially made available for the in-situ and on-line monitoring of all the important parameters of the trench formation process. The trench formation process is lengthy and known to be very critical to the overall success of the DRAM chip manufacturing. In particular, because of the real difficulty of etching the silicon only at the bottom of the trench but not at the collar, a very accurate monitoring control of the redeposited layer thickness is required.

SUMMARY OF THE PRESENT INVENTION

The present invention aims to provide a method for realtime and in-situ monitoring the trench formation process wherein deep trenches are formed in a silicon wafer placed in the reaction chamber of a dry etching equipment.

The reaction chamber is provided with a top view port disposed above the wafer and in parallel relationship therewith. During the plasma processing, a light beam having a specified wavelength L is applied to the wafer through the top view port via an optical cable and a lens. This lens produces a parallel light beam which illuminates a relatively large area of the wafer at a substantially normal angle of incidence. The reflected beam is focused by said lens and transported via another optical cable to a spectrometer tuned on this wavelength. The analog signal that is outputted from this spectrometer is therefore illustrative of the interferences of the reflected light.

Preferably, because signal processing is easier with a digital signal, this analog signal is converted in a digital signal in an A/D converter. The digital signal, referred to as the primary signal S is applied to a computer for signal processing. It has been discovered that said primary signal S is a composite signal which has low frequency and higher frequency components. Therefore, according to an essential aspect of the monitoring method of the present invention, these two components are extracted by numeric filtering in the computer using Cauer type filters. A low-pass filter produces a first secondary signal S1 that is illustrative of the SiO2 layer redeposition and a band-pass filter (centered around the fundamental frequency of the interferometry phenomenon) produces a second secondary signal S2 that is illustrative of the trench etching. As a result, signal S1 thus allows the real-time in-situ monitoring of the deposition rate and of the redeposited layer thickness. On the other hand, signal S2 allows the real-time in-situ monitoring of the trench etch rate and depth.

Preferably, according to another important aspect of the monitoring method of the present invention, a radiation emitted by a specified species of the plasma (e.g. SiBr) having a wavelength L* is observed through a lateral view port provided in the reaction chamber by another spectrometer via an optical cable. This spectrometer generates an analog signal which is representative of the intensity of the plasma and has an amplitude which continuously decreases as far as the trench depth increases. Similarly, this analog signal is digitalized in an A/D converter. The digital signal, referred to as the primary signal S*, is then applied to the computer. The computer is capable to generate the derivative of this signal S* that is labelled S*'. These signals S* and S*' are continuously monitored to detect any anomaly in the plasma that could make the parameters measurements mentioned above unreliable. Therefore, the monitoring method of the present invention allows to continuously monitor the trench depth D and the thickness E of the SiO2 redeposited layer, and simultaneously to have a permanent validation of these parameters.

In essence, the present method simultaneously uses zero order interferometry (through the top view port) and standard optical emission spectroscopy (through the lateral view port). Interferometry provides the deposition rate and deposited layer thickness variations on the one hand, and trench etch rate and depth variations on the other hand. In turn, optical emission spectroscopy is used to identify any anomaly or a plasma extinction during the trench formation process. These data are correlated with interferometry data for validation.

Finally, the method of the present invention allows to accurately stop etching when the desired final trench depth Df has been attained.

Therefore, it is a primary object of the present invention to provide a method for in-situ and on-line monitoring of the trench formation process in a semiconductor structure by dry etching.

It is another object of the present invention to provide a method for in-situ and on-line monitoring of the trench formation process that is essentially based on zero order interferometry.

It is another object of the present invention to provide a method for in-situ and on-line monitoring of the trench formation process wherein a relatively large area of the semiconductor structure is illuminated at a substantially normal angle of incidence with a monochromatic radiation of a specified wavelength.

It is another object of the present invention to provide a method for in-situ and on-line monitoring of the trench formation process wherein the reflected light is applied to a spectrometer to generate a primary signal S of the interferometric type which has a composite nature.

It is another object of the present invention to provide a method for in-situ and on-line monitoring of a trench formation process wherein said primary signal S is first digitalized, then filtered using numeric filter to produce two secondary signals S1 and S2 containing redeposition and trench etching related data respectively.

It is another object of the present invention to provide a method for in-situ and on-line monitoring a trench formation process wherein said numeric filtering includes a low-pass filter and a band-pass filter centered around the fundamental frequency of the interferometry phenomenon.

It is still another object of the present invention to provide a method for in-situ and on-line monitoring of a trench formation process which uses optical emission spectroscopy data that are correlated with the interferometric data for validation thereof.

It is another object of the present invention to provide a method for in-situ and on-line monitoring of the trench formation process wherein the reflected light is applied to another spectrometer to generate a second primary signal S* that is used to detect ar-ly anomaly in the plasma behavior.

It is still further another object of the present invention to provide a method for in-situ and on-line monitoring of a trench formation process that is fully adapted to intelligent and predictive maintenance.

The novel features believed to be characteristic of this invention are set forth in the appended claims. The invention itself, however, as well as other objects and advantages thereof, may be best understood by reference to the following detailed description of an illustrated preferred embodiment to be read in conjunction with the accompanying drawings.

DESCRIPTION OF THE PREFERRED EMBODIMENTS

Description of the System

Figure 1:
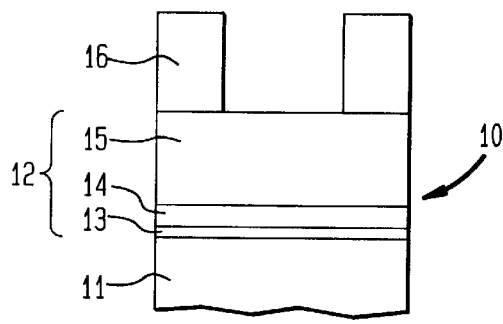
FIGS. 1 to 5 are partial cross-sectional views of a semiconductor structure that schematically illustrate a conventional trench formation process.
Figure 2:
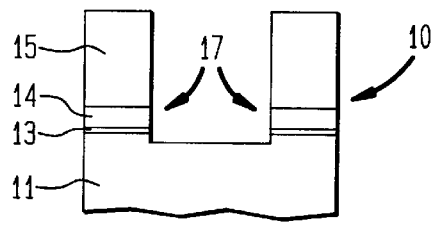
Figure 3:
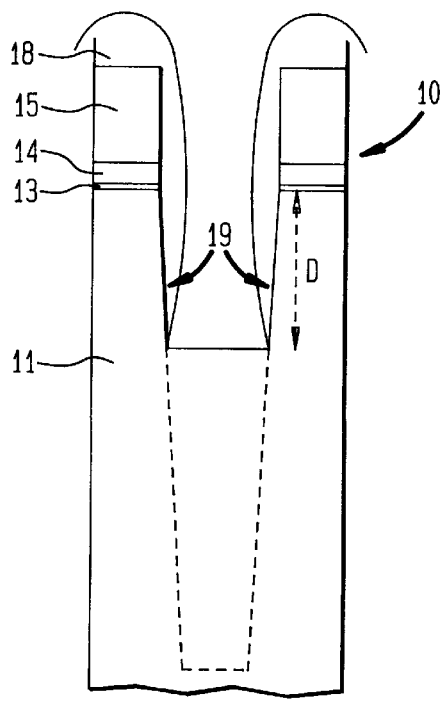
Figure 4:
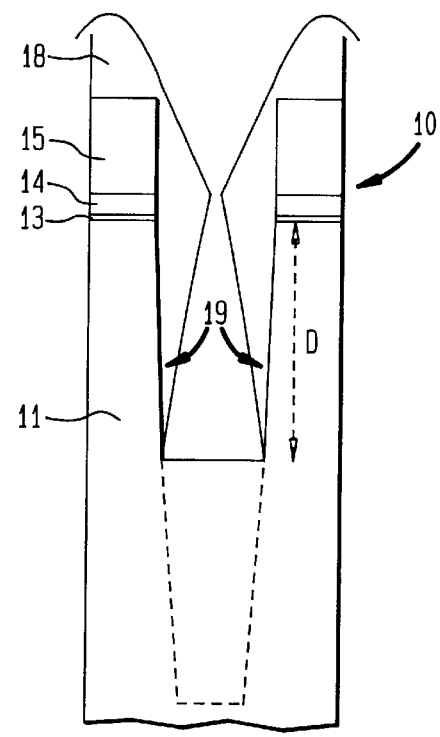
Figure 5:
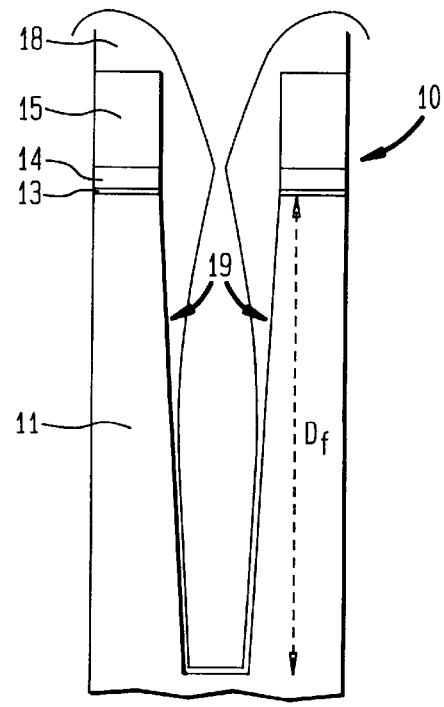
Figure 6:
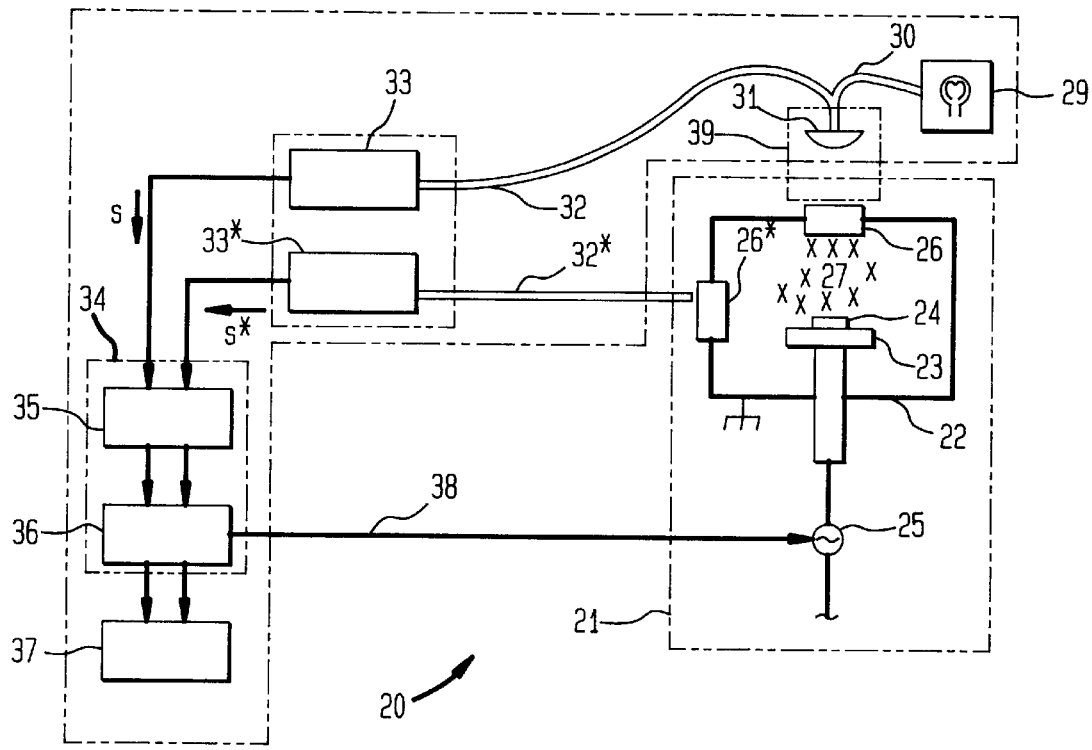
FIG. 6 is a schematic view of the etching and monitoring system which includes top and lateral spectrometers adapted to monitor the trench formation process illustrated in conjunction with FIGS. 1 to 5 according to the present invention.

Now turning to FIG. 6, there is shown the etching and monitoring system 20 that is adapted to carry out the monitoring method of the present invention. System 20 first comprises a dry etching equipment 21 which essentially consists of an etch-treatment (or reaction) chamber 22 enclosing a planar-shaped susceptor 23 that holds the article to be processed (typically a silicon wafer 24) and a RF power supply source 25. According to an essential aspect of the present invention, it is essential the etch-treatment chamber 22 be provided with at least one window or view port made of a material that is transparent for the wavelength of the radiation being used and which permits an adequate illumination of the wafer 24 to produce a strong reflected signal of the interferometric type. An appropriate etching equipment in that respect is the AME precision 5000 tool mentioned above which includes a plurality of single wafer etch-treatment chambers. With such an implementation shown in FIG. 6, the view port referred to as the top view port 26, is located at the top wall of chamber 22. It allows the illumination of wafer 24 substantially at a normal angle of incidence. With this type of tool, susceptor 23 is the cathode and the chamber wall forms the other electrode which is connected to the ground. The plasma 27 generated between the two electrodes contains chemical species that are representative of the etching conditions. While etching is performed, the light emission from these species in the plasma changes in intensity as a function of time, etched material and surface modifications.

System 20 further comprises the monitoring apparatus 28 to reduce to practice the method of the present invention. A light source 29 illuminates the wafer through top view port 26 via a optical cable 30 and a collector lens 31. According to the teachings of the present invention, a specified monochromatic radiation wavelength L is used. Criteria at the base of the wavelength L selection will be discussed later on. The light reflected back from the surface of wafer 24 is focused in optical cable 32 by lens 31, then transported by said optical cable 32 to a spectrometer (or a spectrograph) referred to hereinbelow as the top spectrometer 33. Optical cable 32 has the same construction as optical cable 30. In the present implementation, a plurality of elementary optical fibers are assembled close together and at random to form a single bundle of fibers. Optical cables 30 and 32 are constructed from fibers of a same bundle as apparent from FIG. 6. The elementary optical fibers forming said optical cables 30 and 32 are arranged to have approximately the same optical axis and are perpendicular to the wafer 24. As a result, according to a preferred embodiment of the present invention, optical cables 30 and 32 are viewing the wafer 24 substantially at a normal angle of incidence through top view port 26. Still according to this preferred embodiment, lens 31 ensures illumination of a relatively large area of wafer 24 by a parallel light beam through top view port 26. This particular implementation will be described in more details later on by reference to FIG. 7. However, other implementations, for instance, a focused light beam illuminating only a small area of the wafer could be envisioned as well.

The top spectrometer 33 is for instance the model DIGISEM commercially available from SOFIE INST, Arpajon, France. This model of spectrometer is tunable over a wide-range spectrum of radiations and, in the present case, is tuned on the specified radiation wavelength L mentioned above emitted by mercury lamp 29. As generally known by those skilled in the art, a spectrometer is comprised of a monochromator and a detector. The light transmitted via optical cable 32 is received by the scanning monochromator which selects the specified radiation wavelength. The selected radiation is then received by the detector. The detector may be either a low-noise diode detector or preferably a low-noise photomultiplier tube combined with an analog filter and an amplifier. The analog signal that is outputted by the amplifying section of spectrometer 33 is of the interferometric type because of the particular implementation shown in FIG. 6. This analog signal is applied to a processing/analyzing unit 34 where it will be digitalized and then processed according to the teachings of the present invention. This signal, regardless its analog or digital nature will be referred to hereinbelow as the primary signal S.

According to another significant aspect of the present invention, it is highly desirable to have data related to the optical emission generated by plasma 27. To that end, a lateral optical cable 32* viewing plasma 27 through a lateral or side view port referenced 26* in the close vicinity of the wafer surface and substantially at a zero angle of incidence is connected to another spectrometer (or spectrograph). This spectrometer referred to hereinbelow as the lateral spectrometer 33* thus generates an analog signal that is illustrative of the light intensity changes in the plasma glow discharge. Optical cable 32* is similarly constructed by a bundle of elementary optical fibers. Finally, this analog signal is digitalized before being processed in processing/analyzing unit 34. Signal S*, regardless its analog or digital nature, will be referred to hereinbelow as the primary signal S*.

During the trench formation process, silicon bromine based radicals are produced as a by-product of the reaction and the glow discharge spectrum shows some SiBr radiations over a wide range of wavelengths. As a result, silicon bromine has been the selected species and the shortest wavelength, i.e. the 447 nm radiation (which is well isolated from the other radiations and has the maximum amplitude variation in percent) was selected as wavelength L* on which spectrometer 33* is tuned. As known for those skilled in the art, primary signal S* is capable to provide information on the plasma stability and homogeneity and thus on the process reproducibility from wafer to wafer. Therefore, analog signal S* will be continuously monitored to provide useful information as to any anomaly (or trouble-shooting) produced in the plasma during the trench formation process that could make the trench parameters measurements unreliable.

As apparent from FIG. 6, processing/analyzing unit 34 is comprised of two blocks 35 and 36. Block 35 includes the I/V converters, anti-alaising (low frequency) filters, A/D converters and buffers that are necessary to digitalize analog signals S and S*. Digitalization of analog signals S and S* is performed by the sampling technique as standard. Block 36 is typically a software operated digital computer such as an IBM PS/2 whose key role is to process said primary signals S and S* that are outputted from block 35 once digitalized. Computer 36 generates two signals, referred to as secondary signals S1 and S2, that are obtained from primary signal S by numeric filtering. These signals S1 and S2 are essential to the method of the present invention (their nature will be discussed later on). Moreover, computer 36 generates the derivative signal S*' from primary signal S* still by numeric filtering for a more accurate detection of any instability. Finally, apparatus 28 further includes a printer 37 (or a chart recorder unit or a plotter or a visual display) that is connected to computer 36. Printer 37 allows the printing of all signals that are generated according to the present monitoring method for operator convenience. Computer 36 is able to monitor operation of the etch-treatment chamber 22 in real time through control line 38 which is connected to the RF frequency power supply source 25 via a remote control unit. This line 38 allows automatical switch-off of the trench formation process at etch end-point detection, i.e. when the desired final trench depth Df has been attained or in case of anomalies (plasma extinction or an excessive number of instabilities).

Note that only one spectrometer could be used as well instead of spectrometers 33 and 33*, should an advanced spectrometer such as model SDA sold by SOFIE INST. Arpajon, France be used. This type of advanced spectrometer is provided with a multi-channel photo-diode array.

Preferably, light source 29 which generates said radiation having a specified wavelength L is a low pressure mercury pen ray lamp, such as type 90-0020-01 sold by UVP, San Gabriel, Calif., USA which delivers eight radiations having wavelengths in the 254–579 nm range. However, a xenon arc lamp, such as model L2174-02 sold by HAMAMATSU PHOTONICS KK, Japan that has a continuous spectrum in the 250–800 nm range may adequately offer the desired wavelength irrespective the particular application in consideration. The wavelength L is selected using the following criteria. It must be short enough to allow a high precision control of the deposition phenomenon (which is characterized by its low frequency) by increasing the frequency of signal S1, but not too much, because during the trench formation process a thin layer of SiO2 is also deposited onto the internal face of top view port 26 and the shorter the wavelength, the greater the absorption. Therefore, the choice must result from a compromise between the monitoring of a slow event (the redeposition phenomenon) illustrated by low frequency secondary signal S1 and the monitoring of a fast event (the trench etching) illustrated by secondary signal S2 that has a higher frequency. Optionally, another criterion will be to select a radiation wavelength which does not interfere with the wavelengths of the radiations emitted by the species in the plasma. Avoiding parasitic interactions with the optical emission due to the plasma, will allow a good correlation between the two phenomena: interferometry and optical emission spectroscopy, an effect which is sought according to the present invention. From experiments, it has been demonstrated that a wavelength equal to 365 nm or 407 nm is a very good choice in all respects. In the following description, the specified wavelength L will be selected equal to 365 nm.

Figure 7:
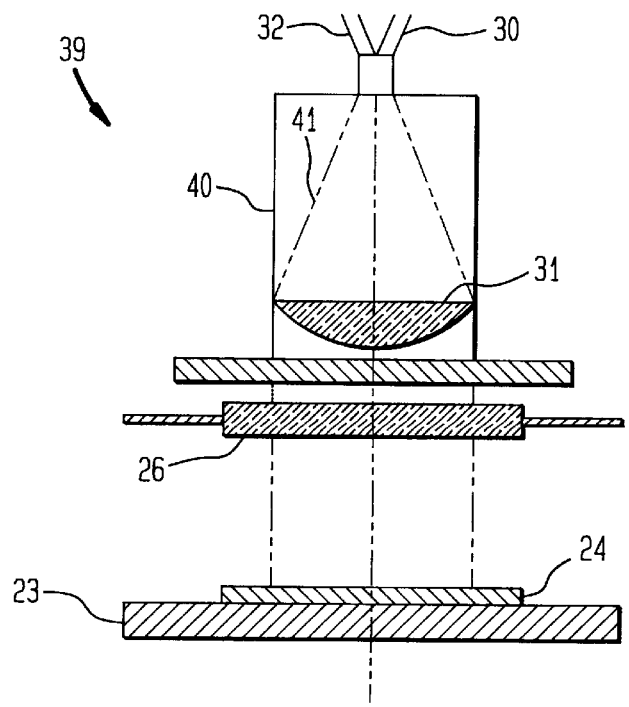
FIG. 7 shows an enlarged view of the collimator section of the system of FIG. 6 that is designed to illuminate a relatively large area of the wafer being processed with a parallel light beam.

FIG. 7 shows the collimator section referenced 39 of the monitoring apparatus 28 of FIG. 6 in more details. It essentially consists of housing 40 which encloses collector lens 31. Housing 40 has a transparent bottom facing top view port 26 and is adapted to receive the merged portion of optical cables 30 and 32 which is connected to its top. The shape of the light beam 41 that is directed onto the wafer (via optical cable 30) and is reflected therefrom (via optical cable 32) is clearly depicted in FIG. 7. The role of collimator section 39 is to convert a small diameter light beam in a parallel beam having a larger diameter, so that a relatively large area (a few square centimeters) of wafer 24 is illuminated. As mentioned above, other implementation (e.g. a focused light beam) could be used.

DESCRIPTION OF THE METHOD OF THE PRESENT INVENTION

Figure 8:
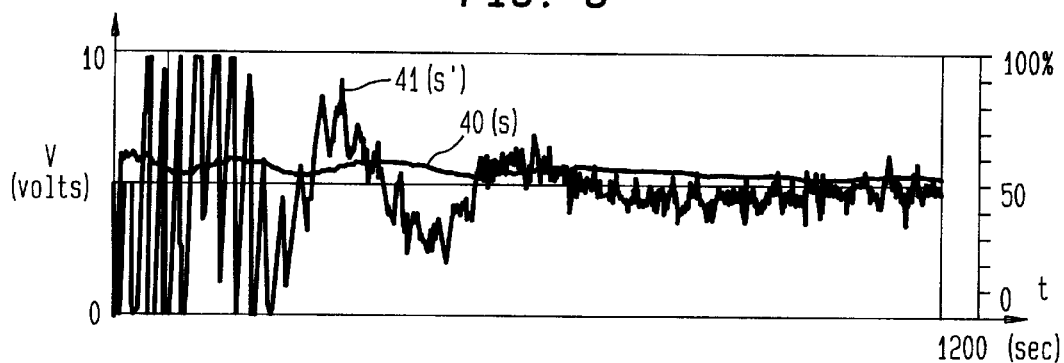
FIG. 8 shows the typical waveform of the primary signal S of a composite nature outputted by the top spectrometer which has not been used in a manufacturing environment so far and the signal S' derived therefrom.

FIG. 8 shows curve 40 illustrating primary signal S (in volts) as a function of time (in seconds) that is generated by the top spectrometer 33 as a result of the wafer surface reflectivity. Curve 41 shows signal S' that is derived from primary signal S after normalization (between 0 and 100%) as standard. Once the anti-alaising filters of block 35 have been stabilized and after magnification, primary signal S appears to be comprised of signals of different nature that are mixed. Obviously, neither primary signal S nor its derivative signal S' can be exploited as such. Inventors have conducted various experiments to understand the nature of the signal components composing the primary signal S of FIG. 8. Assuming first that the relatively high frequency component was parasitic noise caused by the AME 5000 tool, they first filtered out this high frequency component in a low-pass numeric filter. They obtained a low frequency signal that obviously contained useful information with regard to the redeposition phenomenon mentioned above in conjunction with FIGS. 1 to 5, but nothing appeared to be related to the trench formation process. Therefore, the high frequency component was then thoroughly studied. Detailed analysis showed this signal was containing all the trench related information. In essence, the monitoring method of the present invention is therefore based first on the recognition that the primary signal S of the interferometric type generated by the top spectrometer 33 is a composite signal comprised of two components, a low frequency component which contains redeposition related data and a higher frequency component which contains trench formation related data. More specifically, the redeposition related data include the redeposition rate and the redeposited layer thickness while the trench related data include the trench etch rate and depth. As a result, a coefficient R can be defined as the etch rate/redeposition rate ratio. The purpose of the present invention is thus to propose a method of processing the primary signal S generated by the top spectrometer 33 to access to all the the information inherently contained therein, a potential which has not been tapped so far. The basic inventive concept at the base of the present invention is implemented in a practical way by an adequate processing of the primary signal S in two numeric filters. A low-pass filter produces the low frequency component (secondary signal S1) and a high-pass filter or preferably a narrow pass-band filter produces the higher frequency component (secondary signal S2). All these filters are of the elliptic recursive type. The band-pass filter has its central frequency centered on the frequency of the physical phenomenon to be observed by interferometry, i.e. the trench formation process. This centering is automatically performed by an adequate selection of the sampling frequency Fs as standard. Numeric filters are extensively used in a number of technology fields. A numeric filter may be understood as a black box having a determined transfer function in a specific space, e.g. Fourier, Laplace and the like. In the complex plane of Laplace, the transfer function H(p) is defined by the relation H(p)=S(p)/E(p), wherein E(p) is the input signal and S(p) the output signal. A numeric filter of the infinite pulse response is characterized by the following relation:

$$S_n = \sum_{j=0}^{j=q} b_j E_{n-j} - \sum_{i=0}^{i=F} a_i S_{n-i}$$

The synthesis of a numeric filter basically consists in the calculation of these coefficients $a_i$ and $b_j$ once its frequency response is determined. To that end, a known method is based on the use of bands or models which define the forbidden areas where the response is prevented. It now remains to determine the minimum number and the values of said coefficients that provide the desired frequency response.

The greater the number of coefficients, the better the attenuation slope (but at the cost of a slower response). Different types of frequency responses are possible, in the present instance, numeric filters of the Cauer type are preferably used because they provide a good compromise between the number of coefficients to be calculated and the attenuation slope. As known for those skilled in the art, the calculation of said coefficients is performed using abacus or a specific software such as LAB WINDOWS sold by NATIONAL INSTRUMENTS, Austin, USA. A brief survey will be now given by reference to FIG. 9 which is comprised of FIGS. 9A and 9B.

Figure 9A:
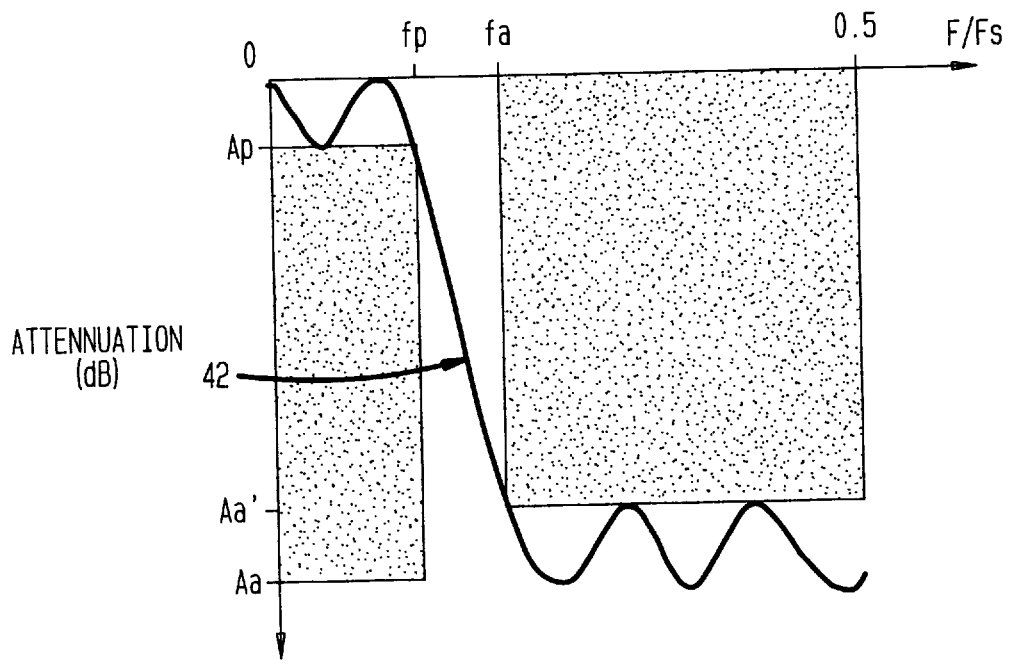
FIG. 9 is comprised of FIGS. 9A and 9B which schematically show the attenuation diagram of the low-pass and band-pass numeric filters that are used to filter the primary signal S of FIG. 8 in accordance with the method of the present invention to generate secondary signals S1 and S2 respectively.

Now turning to FIG. 9A, there is schematically shown the attenuation diagram (in db) of the low-pass filter versus the normalized frequency F/Fs, where Fs is the sampling frequency. As apparent from FIG. 9A, two bands (gray areas) are necessary to define a low-pass filter. In FIG. 9A, fp and fa mean the normalized frequencies that define the cut-off frequency between the pass-band (I) and the attenuated band (II). Likewise, Ap and Aa on the one hand and Aa' on the other hand mean the attenuation levels for the pass-band and the attenuated band respectively. Curve 42 illustrates the typical (normalized) frequency response of a Cauer low-pass filter.

Figure 9B:
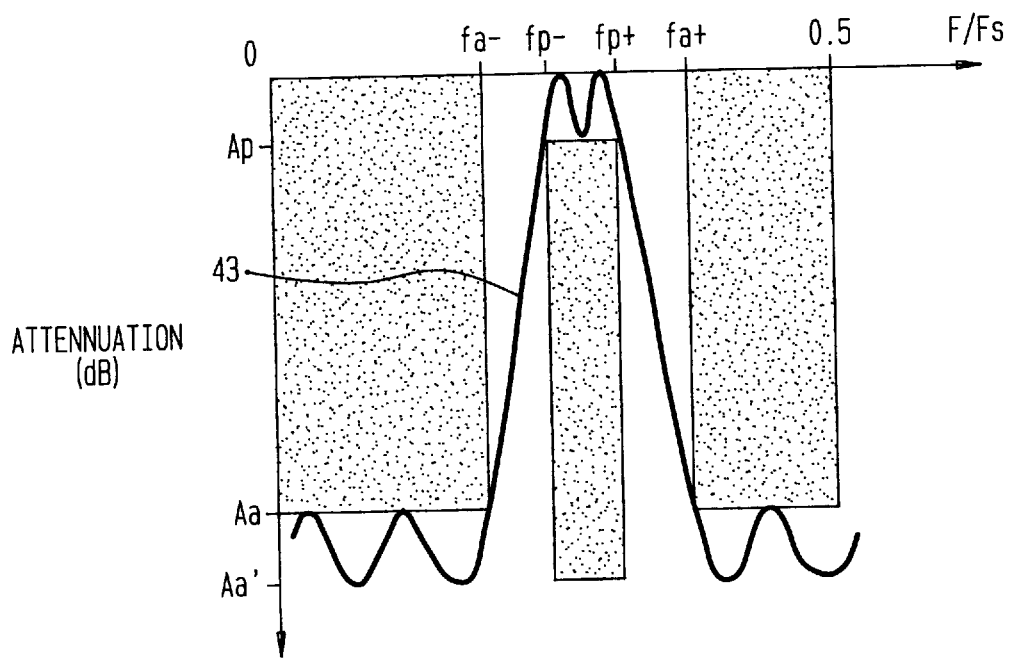

Similarly, FIG. 9B schematically shows the attenuation diagram of the band-pass filter versus the normalized frequency F/Fs. In FIG. 9B, three bands are now necessary to define the band-pass filter, so that a subdivision of normalized frequencies fp and fa is required. On the one hand, frequencies fa− and fa+ define the upper and lower limits of bands I and III respectively, while on the other hand, frequencies fp− and fp+ define the lower and upper limit of band II. Likewise, Ap, Aa and Aa' have the same meaning as mentioned above, i.e. they define the attenuation level of the bands shown in FIG. 9B. Curve 43 illustrates the typical (normalized) frequency attenuation of a Cauer band-pass filter. As mentioned above, the band II is centered on frequency Fo which corresponds to the fundamental frequency of the interferometry phenomenon, so that relation fp−<fo<fp+ (with f0=F0/Fs).

As apparent from curves 40 of FIG. 8, primary signal S is usable by the computer 36 only for a limited period of time approximately equal to 600 sec, after this delay the intensity of this signal would be so weak that it would not be accurate enough. Same reason applies to primary signal S* so that FIGS. 10 to 12 only show signal waveforms for that period of time.

Figure 10:
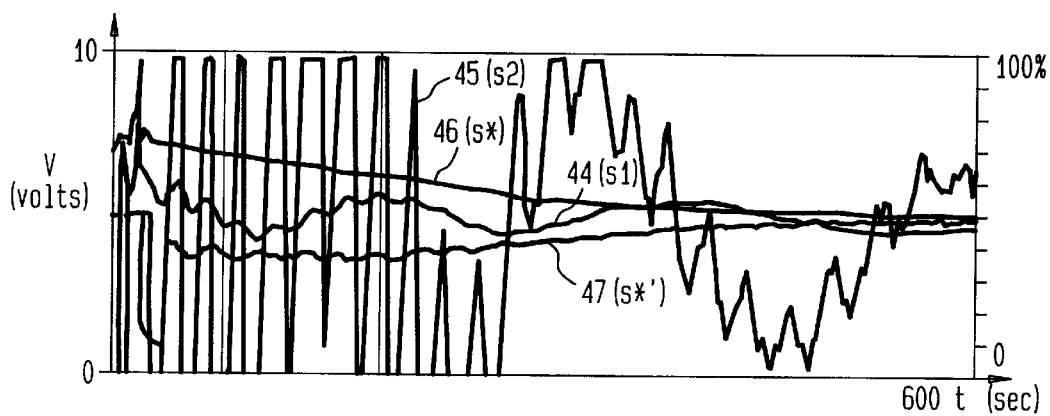
FIG. 10 shows the waveform of the secondary signals S1 and S2 that are obtained after a coarse filtering of the primary signal S of FIG. 8 in two numeric filters whose filter coefficients are not fully adapted on the one hand and the optical emission signal S* and its derivative signal S*' on the other hand.

Now turning to FIG. 10, there is first shown the waveforms of secondary signals S1 and S2 when the filtering of primary signal S is not efficiently performed. Curve 44 illustrates secondary signal S1 which is the low frequency component of primary signal S with a non negligible influence of the high frequency component. Likewise, curve 45 illustrates secondary signal S2 which is the high frequency component of primary signal S with a clear influence of the low frequency component thereon which disturbs its periodicity and shape. As such, secondary signals S1 and S2 still remain difficult to exploit for accurate monitoring of the trench formation process. FIG. 10 further shows curves 46 and 47 which respectively illustrate primary signal S* generated by the lateral spectrometer 33*, referred to as the optical emission signal and signal S*' which is derived therefrom. The role of these signals will be explained hereafter in more details.

Figure 11:
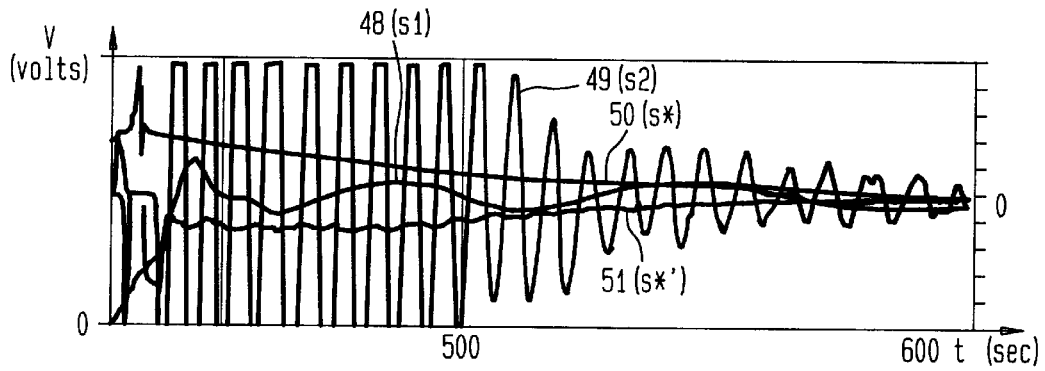
FIG. 11 shows the waveform of the secondary signals S1 and S2 that are obtained after an efficient filtering of the primary signal S of FIG. 8 when adequate filter coefficients have been calculated. Optical emission signal S* and its derivative signal S*' remain unchanged.

FIG. 11 shows the waveforms of same signals i.e. S1, S2, S* and S*' when the coefficients of the numeric filters have been perfectly calculated for an efficient filtering. Curve 48 illustrates secondary signal S1 which clearly appears as being related to a slow event. Curve 49 illustrates secondary signal S2 which clearly appears to be related to a faster event. As a result, only the waveforms in this period of time are shown in FIG. 10. Curve 48 is used to determine the deposition rate and the thickness of the SiO2 redeposited layer while curve 49 is used to determine the trench depth and the etch rate according to the standard method. For instance, as far as signal secondary S1 is concerned, two successive zeroes correspond to a thickness variation dE equal to L/4*N1 wherein L is the specified radiation wavelength and N1 the refractive index of the trench pad according to the theory of the "effective medium" (see for instance, the article: Etch control by use of infrared reflectivity measurements by M. Ray, published in the IBM Technical Disclosure Bulletin, Vol. 34, No 5, Oct. 91, pp 200 & 201). The refractive index N1 is thus determined experimentally. The time interval needed to move from one zero to the other one is equal to a half period T1/2, thus, the redeposition rate R1 for that period of time is such as R1=dE/(T1/2)=L/2*N1*T1. The average redeposition rate R(1) decreases almost linearly as a function of time. Likewise, for secondary signal S2, the trench etch rate R2 for a half period of signal S2 is given by dD/(T2/2)=L/2*N2*T2 wherein dD is the trench depth variation, N2 is the refractive index of the trench and T2 the period of signal S2. The total etching duration (and thus the etch end stop point) is extrapolated from the average trench etch rate value R(2) determined during this period of about 600 sec. According to the particular operating conditions illustrated by reference to FIG. 8, the total etching duration is about 1200 sec to produce a trench depth of 8 um. Still according to these conditions, the following figures have been measured. Typically, for signal S1 (with a sampling period Ts1 of about 3,6 sec), the period T1 is about 200 sec, the refractive index N1 is about 1,5 and the redeposited layer thickness variation dE is about 30 nm/min. For signal S2 (with a sampling period Ts2 of about 0,6 sec), the period T2 is about 20 sec, the refractive index N2 is about 1 and the trench depth variation dD is about 450 nm/min. As a result, as soon as the computer has measured the period for both secondary signals S1 and S2, the essential parameters of the trench formation process can be determined. Still in FIG. 11, curves 50 and 51 illustrate primary signal S* and derivative signal S*' respectively. Signal S* (curve 50) is generally continuously decreasing but not linearly. It decreases linearly and rapidly at the beginning of the trench formation process and more slowly after a certain time, but it is prone to have different shapes. The duration of about 600 sec mentioned above is also adequate to conduct valid measurements on signal S*. Signal S* which contains valuable information as to the plasma behavior is therefore exploited in combination with secondary signals S1 and S2 to provide additional data as to the trench formation process. This point will be now described in more details by reference to FIG. 12.

Figure 12:
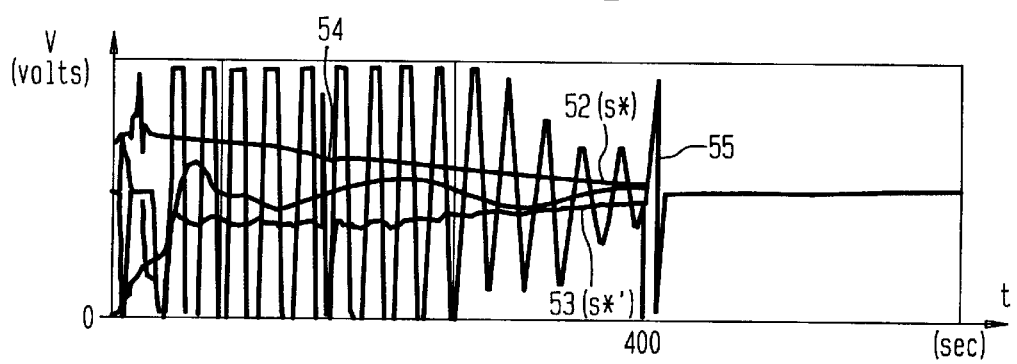
FIG. 12 shows the typical waveforms of the optical emission signal S* and its derivative S*' in case of anomalies consisting of an instability in the plasma followed by a plasma extinction.

FIG. 12 illustrates a typical case where an instability is followed by a plasma extinction. Curves 52 illustrates primary signal S* and curve 53 illustrates signal S*' in another experimentation. The small instability 54 that can be seen in curve 52 becomes much more apparent in curve 53 which exhibits an important surge. Curve 52 also illustrates a plasma extinction at point 55. Both the instability and the plasma extinction can easily be detected. The trench formation process can be automatically stopped should an excessive number of surges be identified. In that regard, a surge counting can be implemented in computer 36 which can also be adapted to detect a plasma extinction.

Figure 13:
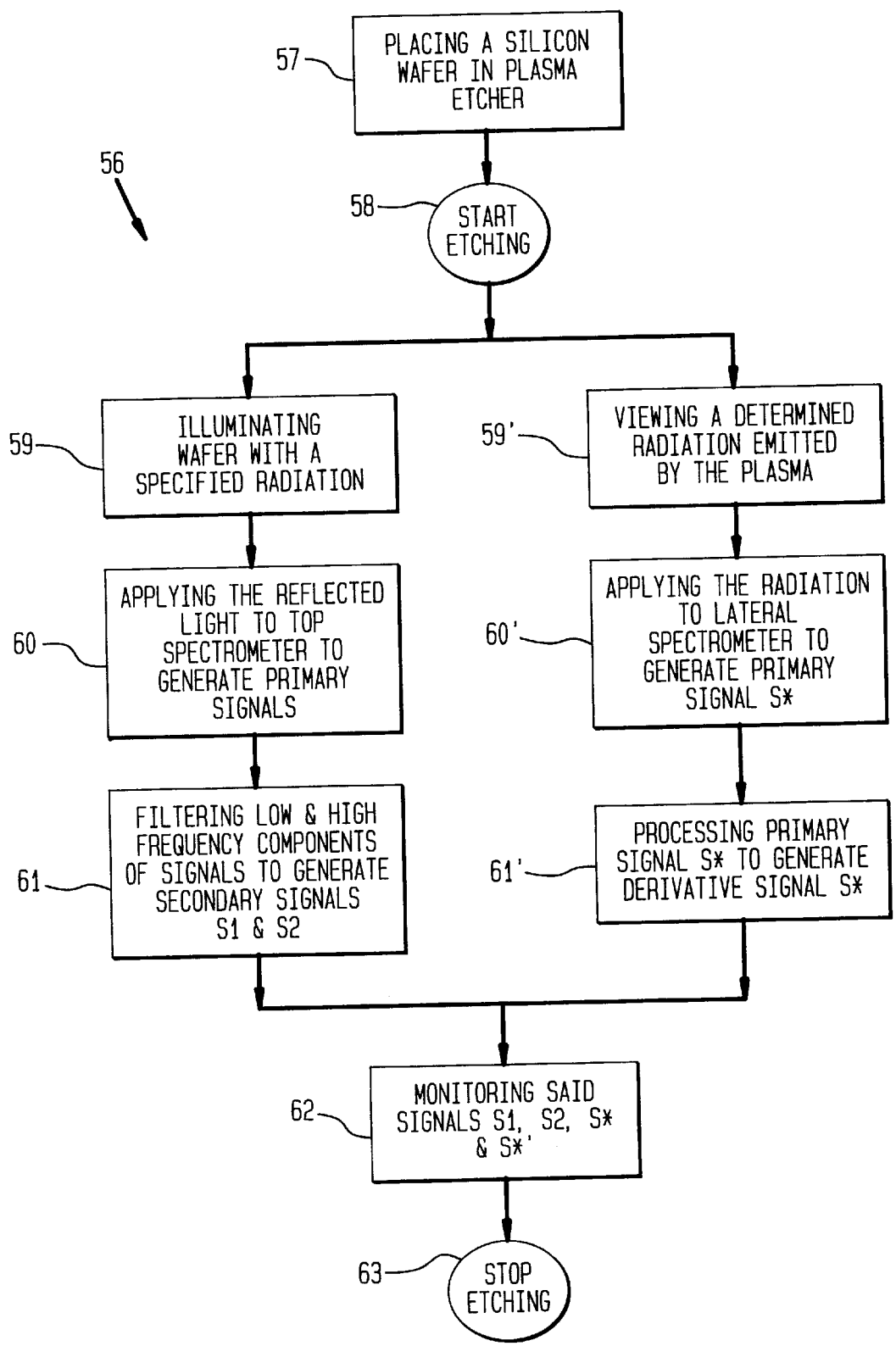
FIG. 13 schematically shows the flow-chart of the essential processing steps of the monitoring method of the present invention.

FIG. 13 shows flow-chart 56 which summarizes the essential steps of the monitoring method of the present invention. According to box 57, the wafer is placed in the evacuated reaction chamber of the dry etching equipment. Then, a plasma that includes oxygen is created (box 58) so that a SiO2 layer is redeposited onto the substrate during trench etching as described above. A relatively large area of the substrate is illuminated with a parallel light beam of a specified radiation at a substantially normal angle of incidence (box 59). Now, according to box 60, the reflected light is applied to the top spectrometer 33 to generate primary signal S of the interferometric type. Next, as apparent from box 61, said primary signal S is applied to two filters in parallel: a low-pass filter to extract the low frequency component and a band pass filter centered around the fundamental frequency of the interferometry phenomenon to extract the higher frequency component to generate respective first and second secondary signals S1 and S2. On the other hand, simultaneously, the light emitted by a specific species (e.g. SiBr) of the plasma is viewed (box 59'). The light is applied to the lateral spectrometer 33* (box 60'), which in turn generates primary signal S* illustrative of the light intensity changes in the plasma. Signal S* is processed to produce its derivative signal labelled S*' in box 61'. Finally, in real time, these signals are monitored in box 62. Said first secondary signal S1 is monitored as a function of time to measure the redeposition rate and the redeposited layer thickness. Said second secondary signal S2 is likewise monitored as a function of time to measure the trench depth and etch rate. Derivative signal S*' is monitored to validate these trench formation parameters just mentioned. As illustrated by box 63, the etching process is stopped when the desired final trench depth Df has been attained.

The monitoring process of the present invention may thus find numerous and valuable applications in the field of semiconductor structure manufacturing and in the field of intelligent and predictive maintenance.

We claim:

1. A method for real-time and in-situ monitoring of trench depth and silicon dioxide redeposited layer thickness parameters during a trench formation process on a silicon wafer comprising the steps of:

a) placing the wafer in an evacuated reaction chamber of an etching apparatus;

b) using an oxygen-comprising plasma to etch a desired pattern of trenches in at least a portion of said wafer such that a silicon dioxide layer is redeposited during trench formation;

c) illuminating an area of said portion with a light beam including at least one first radiation wavelength to produce a reflected interferometric light beam;

d) applying the reflected light to a spectrometer to generate a primary signal;

e) processing said primary signal to extract a first secondary signal having a low frequency component and a second secondary signal having a higher frequency component, wherein said first secondary signal is representative of a deposition rate of said silicon dioxide layer, and said second secondary signal is representative of an etch rate of said trenches;

f) monitoring said silicon dioxide layer deposition with said first secondary signal and a depth of said trenches with said second secondary signal; and, g) in response to said monitoring, stopping the etching when a desired final trench depth has been attained or upon detecting an anomaly in said silicon dioxide layer deposition.

2. The method of claim 1 further comprising the steps of:

i) simultaneously to step (c) observing, at a zero angle of incidence and a second radiation wavelength, species of the plasma in close proximity to the wafer;

j) applying said second radiation wavelength to a spectrometer to generate another primary signal that is illustrative of the optical emission in the plasma;

k) monitoring one of said another primary signal and a derivative of said another primary signal;

l) correlating the monitored signal of step (k) with said secondary signals to detect an anomaly in the plasma.

3. The method of claim 1 wherein step (e) further comprises:

applying said primary signal to two filters in parallel, wherein said two filters include a low-pass filter to extract the low frequency component and a band pass filter centered around the fundamental frequency of the interferometric phenomenon to extract the high frequency component.

4. The method of claim 3 further comprising the steps of:

i) simultaneously to step (c), observing, at a zero angle of incidence and a second radiation wavelength, species of the plasma in close proximity to the wafer;

j) applying said second radiation wavelength to a spectrometer to generate another primary signal that corresponds to an optical emission from the plasma;

k) monitoring one of said another primary signal and a derivative of said another primary signal;

l) correlating the monitored signal of step (k) with said secondary signals to detect an anomaly in the plasma.

5. The method of claim 4 wherein said at least one first radiation wavelength comprises 447 nm radiation.

6. The method of claim 5 wherein said second radiation wavelength is 447 nm.

7. The method of claim 1 wherein the illumination of an area during step (c) further comprises illuminating a large area of the wafer including a large number of trenches.

8. The method of claim 1 wherein the illumination of an area during step (c) further comprises illuminating a small area of the wafer including a small number of trenches.

9. The method of claim 1 wherein said filters are selected from the group consisting of analog filters and numeric filters.

10. The method of claim 9 wherein said numeric filters are Cauer filters.

11. The method of claim 1 wherein said at least one first radiation wavelength comprises 365 nm radiation.

12. The method of claim 11 wherein said at least one first radiation wavelength is 365 nm.

* * * * *